US008138612B2

(12) United States Patent
Hashimoto

(10) Patent No.: US 8,138,612 B2

(45) Date of Patent: Mar. 20, 2012

(54) SEMICONDUCTOR DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 57 days.

(21) Appl. No.: 12/719,033

(22) Filed: Mar. 8, 2010

(65) Prior Publication Data

US 2010/0155944 A1 Jun. 24, 2010

Related U.S. Application Data

(62) Division of application No. 11/483,698, filed on Jul. 10, 2006, now Pat. No. 7,705,453.

(30) Foreign Application Priority Data

Jul. 11, 2005 (JP) ................................ 2005-201798

(51) Int. Cl.
*H01L 23/48* (2006.01)

(52) U.S. Cl. .... 257/779; 257/781; 257/784; 257/E23.02

(58) Field of Classification Search .................. 257/779, 257/781, 784, E23.02, E23.021
See application file for complete search history.

(56) References Cited

U.S. PATENT DOCUMENTS

| | | | | |
|---|---|---|---|---|
| 5,326,712 | A * | 7/1994 | Bae | 438/158 |
| 6,097,091 | A | 8/2000 | Ohsumi | |
| 6,159,837 | A | 12/2000 | Yamaji et al. | |
| 2002/0130412 | A1 * | 9/2002 | Nagai et al. | 257/737 |
| 2004/0012095 | A1 * | 1/2004 | Matsuyama et al. | 257/777 |
| 2004/0056351 | A1 | 3/2004 | Wu et al. | |
| 2004/0094841 | A1 | 5/2004 | Matsuzaki et al. | |

FOREIGN PATENT DOCUMENTS

| | | |
|---|---|---|
| EP | 1427007 | 9/2004 |
| EP | 1 587 142 A1 | 10/2005 |
| JP | 02-272737 | 11/1990 |
| JP | 04-280458 | 10/1992 |
| JP | 2000-150705 | 5/2000 |
| JP | 2003-282635 | 10/2003 |
| JP | 2004-207293 | 7/2004 |
| JP | 2005-057051 | 3/2005 |
| JP | 2005-086165 | 3/2005 |
| WO | WO 2004/053585 A1 | 6/2004 |

OTHER PUBLICATIONS

Communication from Singapore Patent Office re: related application.

* cited by examiner

*Primary Examiner* — Tucker Wright

(74) *Attorney, Agent, or Firm* — Harnes, Dickey & Pierce, P.L.C.

(57) ABSTRACT

A semiconductor device including: a semiconductor substrate including an electrode; a resin protrusion formed on the semiconductor substrate and including a plurality of first portions and a second portion disposed between two of the first portions adjacent to each other; and an interconnect electrically connected to the electrode and extending over one of the first portions of the resin protrusion. A lower portion of a side surface of the second portion includes a portion which extends in a direction intersecting a direction in which the resin protrusion extends.

1 Claim, 2 Drawing Sheets

IC
22 22 22 22 30
24 24 24
20
IB IB
10
14 14 26 28 14
28
IC

SEMICONDUCTOR DEVICE

CROSS-REFERENCE TO RELATED APPLICATIONS

This is a divisional application of U.S. Ser. No. 11/483,698 filed Jul. 10, 2006, claiming priority to Japanese Patent Application No. 2005-201798, filed on Jul. 11, 2005, all of which are hereby incorporated by reference in their entirety.

BACKGROUND OF THE INVENTION

The present invention relates to a semiconductor device.

In order to reduce the size of electronic parts, it is preferable that the external shape of the semiconductor device be small. Along with diversification of the functions of semiconductor devices, the degree of integration of an integrated circuit formed on a semiconductor chip has been increased. Therefore, the number of pins of the semiconductor chip has been increased. Specifically, a semiconductor device has been developed which allows a reduction in size of the semiconductor device and an increase in the degree of integration of the integrated circuit.

As a semiconductor device which can satisfy such demands, a semiconductor device in which an interconnect is formed on a semiconductor chip has attracted attention (see JP-A-2-272737). In this type of semiconductor device, since the external shape of the semiconductor device can be made approximately equal to the external shape of the semiconductor chip, the size of the semiconductor device can be reduced.

The above semiconductor device is required to exhibit high reliability.

SUMMARY

According to one aspect of the invention, there is provided a semiconductor device comprising:

a semiconductor substrate including an electrode;

a resin protrusion formed on the semiconductor substrate and including a plurality of first portions and a second portion disposed between two of the first portions adjacent to each other, a lower portion of a side surface of the second portion including a portion which extends in a direction intersecting a direction in which the resin protrusion extends; and an interconnect electrically connected to the electrode and extending over one of the first portions of the resin protrusion.

DETAILED DESCRIPTION OF THE EMBODIMENT

The invention may provide a highly reliable semiconductor device.

(1) According to one embodiment of the invention, there is provided a semiconductor device comprising:

a semiconductor substrate including an electrode;

a resin protrusion formed on the semiconductor substrate and including a plurality of first portions and a second portion disposed between two of the first portions adjacent to each other, a lower portion of a side surface of the second portion including a portion which extends in a direction intersecting a direction in which the resin protrusion extends; and an interconnect electrically connected to the electrode and extending over one of the first portions of the resin protrusion.

According to this embodiment, a side line length of a bottom portion of the resin protrusion between two adjacent interconnects can be increased. Therefore, since the effective field intensity can be reduced between two adjacent interconnects, a highly reliable semiconductor device can be provided in which an electrical short circuit due to migration rarely occurs.

(2) In this semiconductor device, two of the first portions adjacent to each other may be relatively displaced in opposite directions intersecting the direction in which the resin protrusion extends.

(3) In this semiconductor device, two of the first portions adjacent to each other may be arranged in the direction in which the resin protrusion extends; and the second portion may include a portion having a width smaller than a width of the first portion.

(4) In this semiconductor device, the second portion may have a height which is smaller than a height of the first portion.

(5) In this semiconductor device, the first portions may have the same shape.

Some embodiments of the invention will be described in detail below, with reference to the drawings. Note that the invention is not limited to the following embodiments.

Figure 1A:
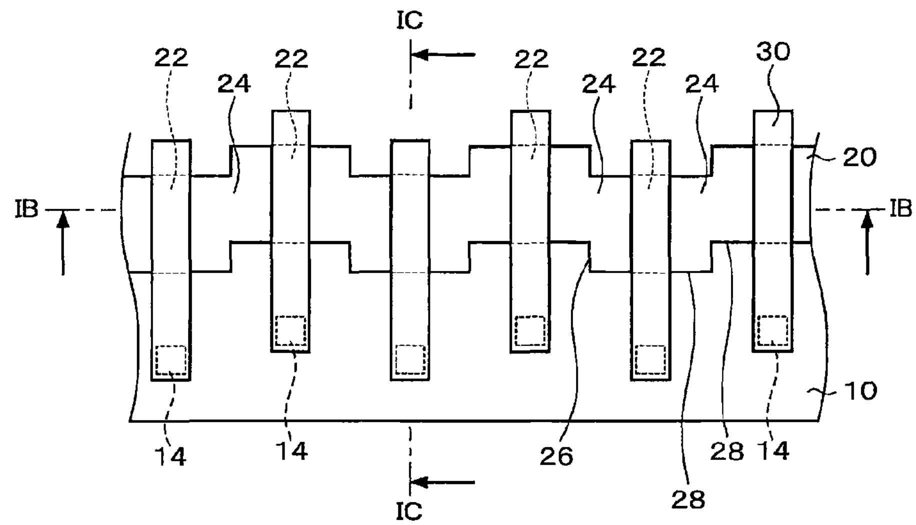
FIGS. 1A to 1C are views illustrative of a semiconductor device according to an embodiment to which the invention is applied.
Figure 1B:
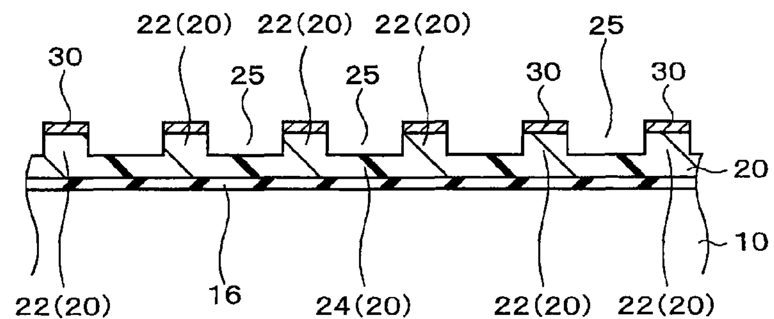
Figure 1C:
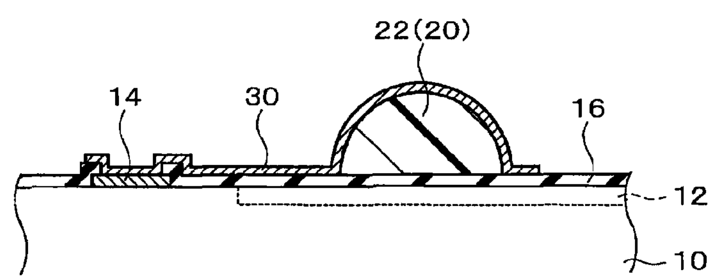
Figure 2:
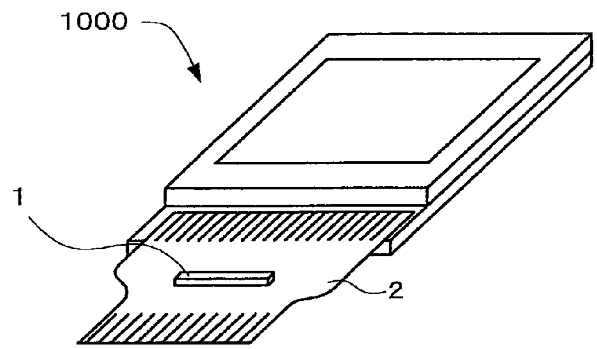
FIG. 2 is a view showing an electronic module on which a semiconductor device according to an embodiment to which the invention is applied is mounted.

FIGS. 1A to 2 are views illustrative of a semiconductor device according to an embodiment to which the invention is applied. FIG. 1A is a top view of a semiconductor device 1 according to an embodiment to which the invention is applied. FIG. 1B is a partially enlarged cross-sectional view along the line IB-IB shown in FIG. 1A, and FIG. 1C is a partially enlarged cross-sectional view along the line IC-IC shown in FIG. 1A. FIG. 2 is a view showing an electronic module on which the semiconductor device 1 is mounted.

As shown in FIGS. 1A to 1C, the semiconductor device according to this embodiment includes a semiconductor substrate 10. The semiconductor substrate 10 may be a silicon substrate or the like. The semiconductor substrate 10 may be in the shape of a chip (see FIG. 2). The surface (active surface) of the semiconductor substrate 10 on which electrodes 14 are formed may be rectangular. The active surface of the semiconductor substrate 10 may be square (not shown). Or, the semiconductor substrate 10 may be in the shape of a wafer. One or more integrated circuits 12 may be formed on the semiconductor substrate 10 (one integrated circuit may be formed on a semiconductor chip and two or more integrated circuits may be formed on a semiconductor wafer) (see FIG. 1C). The configuration of the integrated circuit 12 is not particularly limited. For example, the integrated circuit 12 may include an active element such as a transistor and a passive element such as a resistor, coil, or capacitor.

As shown in FIGS. 1A and 1C, the semiconductor substrate 10 includes the electrodes 14. The electrode 14 may be electrically connected with the inside of the semiconductor substrate 10. The electrode 14 may be electrically connected with the integrated circuit 12. A conductor which is not electrically connected with the integrated circuit 12 may also be referred to as the electrode 14. The electrode 14 may be part of an internal interconnect of the semiconductor substrate. In this case, the electrode 14 may be a portion of the internal interconnect of the semiconductor substrate used for electrical connection with the outside. The electrode 14 may be formed of a metal such as aluminum or copper. The electrodes 14 may be arranged along one side of the active surface of the semiconductor substrate 10. The electrodes 14 may be disposed in a staggered arrangement (see FIG. 1A). The electrodes 14 may be arranged on one virtual straight line (see FIG. 3). Or, the electrodes 14 may be randomly arranged.

As shown in FIGS. 1B and 1C, the semiconductor substrate 10 may include a passivation film 16. The passivation film 16 may be formed to expose the electrode 14. The passivation film 16 may have an opening which exposes the electrode 14. The passivation film 16 may be formed to partially cover the electrode 14. In this case, the passivation film 16 may be formed to cover the edge of the electrode 14. The passivation film may be an inorganic insulating film formed of $SiO_2$, SiN, or the like. The passivation film 16 may be an organic insulating film formed of a polyimide resin or the like.

As shown in FIGS. 1A to 1C, the semiconductor device according to this embodiment includes a resin protrusion 20 formed on the semiconductor substrate 10. The resin protrusion 20 may be formed on the passivation film 16. The material for the resin protrusion 20 is not particularly limited. A known material may be used as the material for the resin protrusion 20. For example, the resin protrusion 20 may be formed of a resin such as a polyimide resin, silicone-modified polyimide resin, epoxy resin, silicone-modified epoxy resin, benzocyclobutene (BCB), or polybenzoxazole (PBO). The resin protrusion 20 may extend along the side of the surface (active surface) of the semiconductor substrate 10 on which the integrated circuit 12 is formed. When the active surface of the semiconductor substrate 10 is rectangular, the resin protrusion 20 may have a shape which extends along the long side of the active surface, for example.

The resin protrusion 20 includes a plurality of first portions 22 and a second portion 24 disposed between two adjacent first portions 22. Specifically, the resin protrusion 20 may include a plurality of first portions 22 and a plurality of second portions 24, in which the first and second portions 22 and 24 may be alternately disposed. As shown in FIG. 1B, the first and second portions 22 and 24 may be integrally formed.

The first portion 22 is part of the resin protrusion 20 and a region in which an interconnect 30 described later is formed (or a region covered by the interconnect 30). As shown in FIG. 1A, two adjacent first portions 22 may be relatively displaced in opposite directions intersecting the direction in which the resin protrusion 20 extends. The direction in which two adjacent first portions 22 are relatively displaced may be a direction in which the interconnect 30 extends. The centers of two adjacent first portions 22 may be relatively displaced in opposite directions intersecting the direction in which the resin protrusion 20 extends. When the resin protrusion 20 has a shape which extends along one side of the semiconductor substrate 10, two adjacent first portions 22 may be relatively displaced in opposite directions intersecting the side. The first portions 22 may be disposed in a staggered arrangement. The lower portion of the side surface of the second portion 24 includes a portion 26 which extends in the direction intersecting the direction in which the resin protrusion 20 extends (see FIG. 1A). In other words, an outline of a bottom surface (or a surface facing the semiconductor substrate 10) of the second portion 24 of the resin protrusion 20 may include a portion which extends in the direction intersecting the direction in which the resin protrusion 20 extends. Alternatively, the side surface of the second portion 24 may have an extension portion 28 extending from the side surface of the first portion 22 in the direction in which the resin protrusion 20 extends, and a connection portion which connects two extension portions 28. The connection portion may extend in the direction intersecting the direction in which the resin protrusion 20 extends.

The surface of the resin protrusion 20 may be curved. In particular, the surface of the first portion 22 may be curved. In this case, the cross-sectional shape of the resin protrusion 20 (first portion 22) may be a semicircle, as shown in FIG. 1C. The first portions 22 forming one resin protrusion 20 may have the same shape. In this case, all the first portions 22 may have the same shape. The second portion 24 may include a portion having a height smaller than that of the first portion 22. The entire second portion 24 may have a height smaller than that of the first portion 22. Specifically, the resin protrusion 20 may have a shape which includes a recess 25 provided between two adjacent first portions 22, as shown in FIG. 1B.

The formation method for the resin protrusion 20 is not particularly limited. The resin protrusion 20 may be formed by curing (e.g. thermally curing) a patterned resin material, for example. Or, the resin protrusion 20 may be formed by forming a resin section having a shape along one straight line and removing part of the resin section. The resin protrusion 20 may be formed by molding.

As shown in FIGS. 1A to 2, the semiconductor device according to this embodiment includes the interconnects 30. The interconnect 30 is electrically connected with the electrode 14. The interconnect 30 is formed to extend over the resin protrusion 20. The interconnect 30 is formed to extend over the first portion 22 of the resin protrusion 20. The interconnect 30 may be formed to contact the semiconductor substrate 10 on each side of the resin protrusion 20. Specifically, the interconnect 30 may be formed to climb over the resin protrusion 20.

The structure and the material for the interconnect 30 are not particularly limited. For example, the interconnect 30 may be formed to include a plurality of layers. In this case, the interconnect 30 may include a first layer formed of titanium tungsten and a second layer formed of gold (not shown). Or, the interconnect 30 may be formed of a single layer.

The semiconductor device 1 according to this embodiment may have the above-described configuration. As described above, the lower portion of the side surface of the second portion 24 of the resin protrusion 20 includes the portion 26 which extends in the direction which intersects the direction in which the resin protrusion 20 extends. According to this configuration, a side line length of the lower portion of the resin protrusion 20 between two adjacent first portions 22 can be increased. Therefore, since the effective field intensity can be reduced between two adjacent interconnects 30, an electrical short circuit due to migration rarely occurs. This structure need not necessarily be provided over the entire resin protrusion 20, but may be provided (only) in an area in which migration tends to occur (e.g. between portions of the resin protrusion 20 in which the field intensity is high). In this case, the side surface of the second portion 24 may be linearly formed in the other area (area in which migration rarely occurs) without being displaced in the direction which intersects the direction in which the resin protrusion 20 extends.

In the manufacturing process of the semiconductor device, a carbide layer (or plasma polymerization layer) may be formed on the surface of the resin protrusion 20. Since the carbide layer or the plasma polymerization layer has an insulation resistance lower than that of the resin, an electrical short circuit tends to occur between two interconnects formed on the carbide layer or the plasma polymerization layer in comparison with two interconnects formed on the resin layer. As the interconnects are reduced in size and pitch, a decrease in the insulation resistance may affect the reliability of the semiconductor device.

A technology has been known in which the insulation resistance between interconnects is ensured by removing the carbide layer between two adjacent interconnects in order to manufacture a highly reliable semiconductor device. For example, the resin layer between two adjacent interconnects may be removed by $O_2$ plasma etching. In the semiconductor device 1, the recess 25 between two adjacent first portions 22 may be formed by etching the resin protrusion 20 using the interconnects 30 as a mask. However, the surface of the lower portion of the resin protrusion 20 has an angle of about 90° with respect to the semiconductor substrate 10. Therefore, it is difficult to reliably remove the carbide layer formed on the surface of the lower portion of the resin protrusion 20 in a short time by using a known method. Moreover, the integrated circuit and the interconnect 30 on the semiconductor substrate may be damaged when the etching time is increased.

According to this embodiment, the length of the lower portion of the side surface of the second portion 24 of the resin protrusion 20 can be increased. Specifically, a side line length of the resin protrusion 20 between two adjacent interconnects 30 can be increased. Therefore, even if the carbide layer is formed on the lower portion of the side surface of the second portion 24 of the resin protrusion 20 (even if the carbide layer remains without being completely removed), an electrical short circuit rarely occurs between two adjacent interconnects 30.

Part of the interconnect 30 which covers the top portion of the first portion is used as an external terminal of the semiconductor device, as described later. Specifically, the resin protrusion 20 (first portion 22) is pressed against another member. In this case, if the first portions have the same shape, the pressure applied to all the first portions can be made equal. Therefore, a semiconductor device exhibiting excellent mounting capability can be provided.

The resin protrusion 20 may have a structure in which the recess 25 is formed between two adjacent first portions 22. According to this structure, occurrence of migration between two adjacent interconnects 30 on the top portion of the resin protrusion 20 can be prevented.

Therefore, the semiconductor device according to this embodiment allows provision of a semiconductor device which exhibits excellent mounting capability and high electrical reliability.

When the electrodes 14 are disposed in a staggered arrangement, two adjacent interconnects 30 may have the same distance between the electrode 14 and the top portion of the first portion 22 of the resin protrusion 20.

FIG. 2 shows an electronic module 1000 on which the semiconductor device 1 is mounted. In the example shown in FIG. 2, the semiconductor device 1 is mounted on a substrate 2. The substrate 2 may be a rigid substrate (e.g. glass substrate or silicon substrate) or a flexible substrate (e.g. film substrate). The semiconductor device 1 may be mounted on the substrate 2 so that the side on which the interconnects 30 are formed faces the substrate 2. An interconnect of the substrate 2 and the interconnect 30 of the semiconductor device 1 may contact and be electrically connected. In more detail, the interconnect of the substrate 2 and part of the interconnect 30 which covers the resin protrusion 20 may contact and be electrically connected. This allows the interconnect 30 to be pressed against the interconnect of the substrate 2 due to the elasticity of the resin protrusion 20 (first portion 22). Therefore, an electronic module exhibiting high electrical connection reliability can be provided. The semiconductor device 1 may be bonded to the substrate 2 using an adhesive (resin-based adhesive). The electronic module 1000 may be a display device. The display device may be a liquid crystal display device, an electroluminescent (EL) display device, or the like. The semiconductor device 1 may be a driver IC which controls the display device. The semiconductor device 1 may be directly mounted on a glass substrate of the electronic module 1000. In this case, the interconnect pattern of the electronic module 1000 may be formed on glass. When the interconnect pattern of the electronic module 1000 is formed on glass, the mounting configuration is called chip-on-glass (COG) mounting. The connection mechanism of COG mounting is the same as the above-described connection mechanism in which the semiconductor device 1 is mounted on the substrate.

Modification

Figure 3:
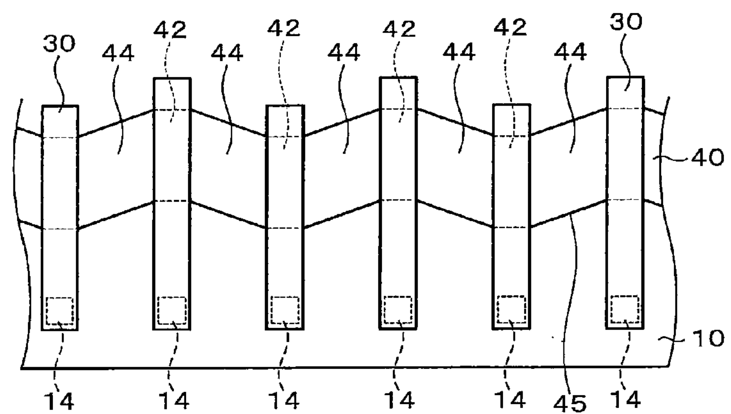
FIG. 3 is a view illustrative of a semiconductor device according to a modification of an embodiment to which the invention is applied.

In the example shown in FIG. 3, the semiconductor device includes a resin protrusion 40. The resin protrusion 40 includes a plurality of first portions 42 and a second portion 44 disposed between two adjacent first portions 42. As shown in FIG. 3, a lower portion 45 of the side surface of the second portion 44 may extend in the direction which intersects the direction in which the resin protrusion 40 extends. In other words, the lower portion 45 of the side surface of the second portion 44 may extend along a straight line which connects the side surfaces of two adjacent first portions 42.

Figure 4:
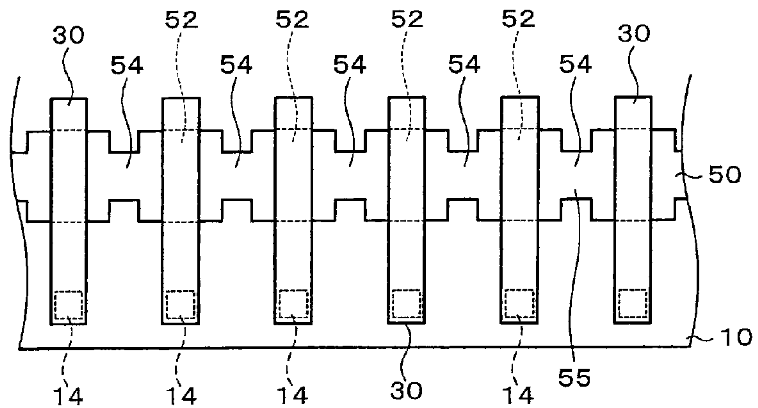
FIG. 4 is a view illustrative of a semiconductor device according to another modification of an embodiment to which the invention is applied.

In the example shown in FIG. 4, the semiconductor device includes a resin protrusion 50. The resin protrusion 50 includes a plurality of first portions 52 and a second portion 54 disposed between two adjacent first portions 52. As shown in FIG. 4, the first portions 52 may be arranged along the direction in which the resin protrusion 50 extends. For example, the first portions 52 may be arranged along one side of the active surface of the semiconductor substrate 10. The second portion 54 includes a portion 55 having a width smaller than that of the first portion 52. The term "width" used herein refers to the length of the second portion 54 in the direction which intersects the direction in which the resin protrusion 50 extends. Specifically, the second portion 54 may have a shape which is partially reduced in width.

According to these modifications, a highly reliable semiconductor device can be provided in which an electrical short circuit due to migration rarely occurs between two adjacent interconnects 30.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device comprising:

a semiconductor substrate having a first surface;

plurality of electrodes formed directly on the first surface, the electrodes being disposed in a staggered arrangement in a plan view;

a passivation film formed on the first surface of the substrate, the passivation film including a plurality of openings exposing the electrodes on the first surface;

a resin protrusion formed on the passivation film, the resin protrusion having a semicircular cross-sectional shape and integrally including a plurality of first and second portions alternately disposed in a first direction along the substrate so that each second portion is disposed between two adjacent first portions, the first portions being disposed in a staggered arrangement in the plan view so that adjacent first portions are relatively displaced in opposite directions intersecting the first direction; and a plurality of interconnects each extending in a second direction intersecting the first direction along the first surface, each interconnect being electrically connected to a corresponding one of the electrodes, each interconnect crossing over a corresponding one of the first portions of the resin protrusion and then reengaging the first surface;

wherein each second portion has connection portion and a plurality of extension portions, each connection portion being disposed between two extension portions, each connection portion having a length in the second direction that is less than a length of the first portion in the second direction, and each extension portion having a length in the second direction that is the same as the length of the first portion in the second direction; and wherein each second portion has a height relative to the first surface that is less than a height of each first portion relative to the first surface.

* * * * *